(12) United States Patent
Cook et al.

(10) Patent No.: US 10,020,219 B2
(45) Date of Patent: Jul. 10, 2018

(54) METHOD FOR REALIZING ULTRA-THIN SENSORS AND ELECTRONICS WITH ENHANCED FRAGILITY

(71) Applicant: THE CHARLES STARK DRAPER LABORATORY, INC., Cambridge, MA (US)

(72) Inventors: Eugene H. Cook, Acton, MA (US); Amy Duwel, Cambridge, MA (US); David J. Carter, Concord, MA (US); Gayatri E. Perlin, Arlington, MA (US)

(73) Assignee: THE CHARLES STARK DRAPER LABORATORY, INC., Cambridge, MA (US)

( * ) Notice: Subject to any disclaimer, the term of this patent is extended or adjusted under 35 U.S.C. 154(b) by 0 days.

(21) Appl. No.: 15/727,195

(22) Filed: Oct. 6, 2017

(65) Prior Publication Data
US 2018/0033670 A1 Feb. 1, 2018

Related U.S. Application Data

(62) Division of application No. 15/207,185, filed on Jul. 11, 2016.

(51) Int. Cl.
| | |
|---|---|
| H01L 21/683 | (2006.01) |
| H01L 21/78 | (2006.01) |
| H01L 21/304 | (2006.01) |
| H01L 21/3065 | (2006.01) |
| H01L 23/00 | (2006.01) |
| G06K 19/073 | (2006.01) |

(52) U.S. Cl.
CPC .... *H01L 21/6835* (2013.01); *G06K 19/07381* (2013.01); *H01L 21/304* (2013.01); *H01L 21/3065* (2013.01); *H01L 21/78* (2013.01); *H01L 23/57* (2013.01); *H01L 2221/68327* (2013.01)

(58) Field of Classification Search
None
See application file for complete search history.

(56) References Cited

U.S. PATENT DOCUMENTS

| 5,773,878 | A | 6/1998 | Lim et al. |
| 6,740,913 | B2 | 5/2004 | Doyle et al. |
| 8,492,196 | B2 | 7/2013 | Pagaila et al. |
| 9,412,663 | B1 | 8/2016 | Andry et al. |
| 2003/0141570 | A1 | 7/2003 | Chen et al. |
| 2010/0301431 | A1 | 12/2010 | Ding et al. |

FOREIGN PATENT DOCUMENTS

CN 2372262 Y 4/2000

OTHER PUBLICATIONS

International Search Report and Written Opinion from corresponding International Application No. PCT/US2017/041321 dated Oct. 10, 2017.

(Continued)

*Primary Examiner* — Whitney T Moore
(74) *Attorney, Agent, or Firm* — Lando & Anastasi, LLP

(57) ABSTRACT

A method of fabricating ultra-thin semiconductor devices includes forming an array of semiconductor dielets mechanically suspended on a frame with at least one tether connecting each semiconductor dielet of the array of semiconductor dielets to the frame.

19 Claims, 15 Drawing Sheets

(56) References Cited

OTHER PUBLICATIONS

Wikipedia, Chemical-mechanical planarization, Mar. 11, 2016; p. 1/4, highlight; Retrieved on Aug. 31, 2016, from <https://en.wikipedia.org/wiki/Chemical-mechanical_planarization>.
P. Ralston, D. Fry, S. Suko, B. Winters, M. King and R. Kober, "Defeating counterfeiters with microscopic dielets embedded in electronic components," in Computer, vol. 49, No. 8, pp. 18-26, Aug. 2016.

METHOD FOR REALIZING ULTRA-THIN SENSORS AND ELECTRONICS WITH ENHANCED FRAGILITY

CROSS REFERENCE TO RELATED APPLICATIONS

This application claims priority under 35 U.S.C. § 121 as a division of U.S. patent application Ser. No. 15/207,185, titled "METHOD FOR REALIZING ULTRA-THIN SENSORS AND ELECTRONICS WITH ENHANCED FRAGILITY," filed on Jul. 11, 2016, which is incorporated herein in by reference in its entirety for all purposes.

FIELD OF INVENTION

Aspects and embodiments disclosed herein are generally directed to ultra-thin sensor and circuit components and to methods for fabricating same.

BACKGROUND

In present day foundry processes active circuit functionality is achieved at depths of ~100 nm or less in semiconductor substrates and most of the bulk of the substrates are used to provide structural rigidity rather than electrical functionality.

SUMMARY

In accordance with an aspect of the present disclosure, there is provided a method of fabricating ultra-thin semiconductor devices. The method comprises forming an array of semiconductor dielets mechanically suspended on a frame with at least one tether connecting each semiconductor dielet of the array of semiconductor dielets to the frame.

In some embodiments, the method further comprises forming fragility enhancing features in the semiconductor dielets.

In some embodiments, forming the fragility enhancing features in the semiconductor dielets includes forming etchings in the semiconductor dielets.

In some embodiments, the fragility enhancing features are configured to cause the semiconductor dielets to fracture under the influence of an external force.

In some embodiments, the fragility enhancing features are configured to cause the semiconductor dielets to deform and become strained in a manner that degrades electrical performance under the influence of an external force.

In some embodiments, the fragility enhancing features are configured to cause the semiconductor dielets to deform and become strained in a manner that alters carrier mobility in transistors of the semiconductor dielets under the influence of the external force.

In some embodiments, the external force exacerbates pre-existing inherent strain that exists in fabricated active devices of the semiconductor dielets caused by the oxide and/or interlayer dielectric (ILD) and metal routing layers to achieve a strain that causes failure of the semiconductor dielets.

In some embodiments, the method further comprises etching a notch in the at least one tether.

In some embodiments, the method further comprises bonding a device wafer including active areas to a carrier wafer with the active areas facing the carrier wafer and aligned with recesses defined in the carrier wafer, thinning the device wafer, and etching trenches about the peripheries of the active areas. The trenches define the at least one tether, boundaries of the semiconductor dielets, and the frame.

In some embodiments, the method comprises etching the trenches prior to bonding the device wafer to the carrier wafer.

In some embodiments, the method comprises etching the trenches subsequent to thinning the device wafer.

In some embodiments, thinning the device wafer includes thinning the device wafer to a thickness of about 10 µm or less.

In some embodiments, thinning the device wafer includes spin etching a rear side of the device wafer.

In some embodiments, forming the array of semiconductor dielets includes forming the semiconductor dielets with thicknesses of about 10 µm.

In some embodiments, forming the array of semiconductor dielets includes forming the semiconductor dielets with spacings of about 10 µm to 50 µm between adjacent semiconductor dielets.

In some embodiments, the method further comprises forming electrically conductive traces on the frame and in electrical communication with the semiconductor dielets.

In some embodiments, the method further comprises singulating the semiconductor dielets from the frame by mechanically punching the semiconductor dielets from the frame.

In some embodiments, the method further comprises singulating the semiconductor dielets from the frame by pulling the semiconductor dielets from the frame using a vacuum pick tool.

In some embodiments, the method further comprises singulating the semiconductor dielets from the frame by destroying the at least one tether with a joule heater integrated into the at least one tether.

In some embodiments, the method further comprises singulating the semiconductor dielets from the frame by destroying the at least one tether by laser ablation.

In accordance with another aspect, there is provided a semiconductor dielet. The semiconductor dielet comprises a substrate, an active layer formed on an upper surface of the substrate and including active devices, and one or more fragility enhancing features on a lower surface of the substrate. The one or more fragility enhancing features reduce the mechanical strength of the dielet as compared to a substantially similar dielet lacking the one or more fragility enhancing features.

In some embodiments, the one or more fragility enhancing features include one or more of a trench and a cavity defined in the lower surface of the substrate.

In some embodiments, the semiconductor dielet is included in a security tag.

In some embodiments, the semiconductor dielet is configured to self-destruct responsive to the security tag being removed from an object to which the security tag had been secured.

In some embodiments, the semiconductor dielet further comprises a tether remnant coupled to and extending from an edge of the dielet.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
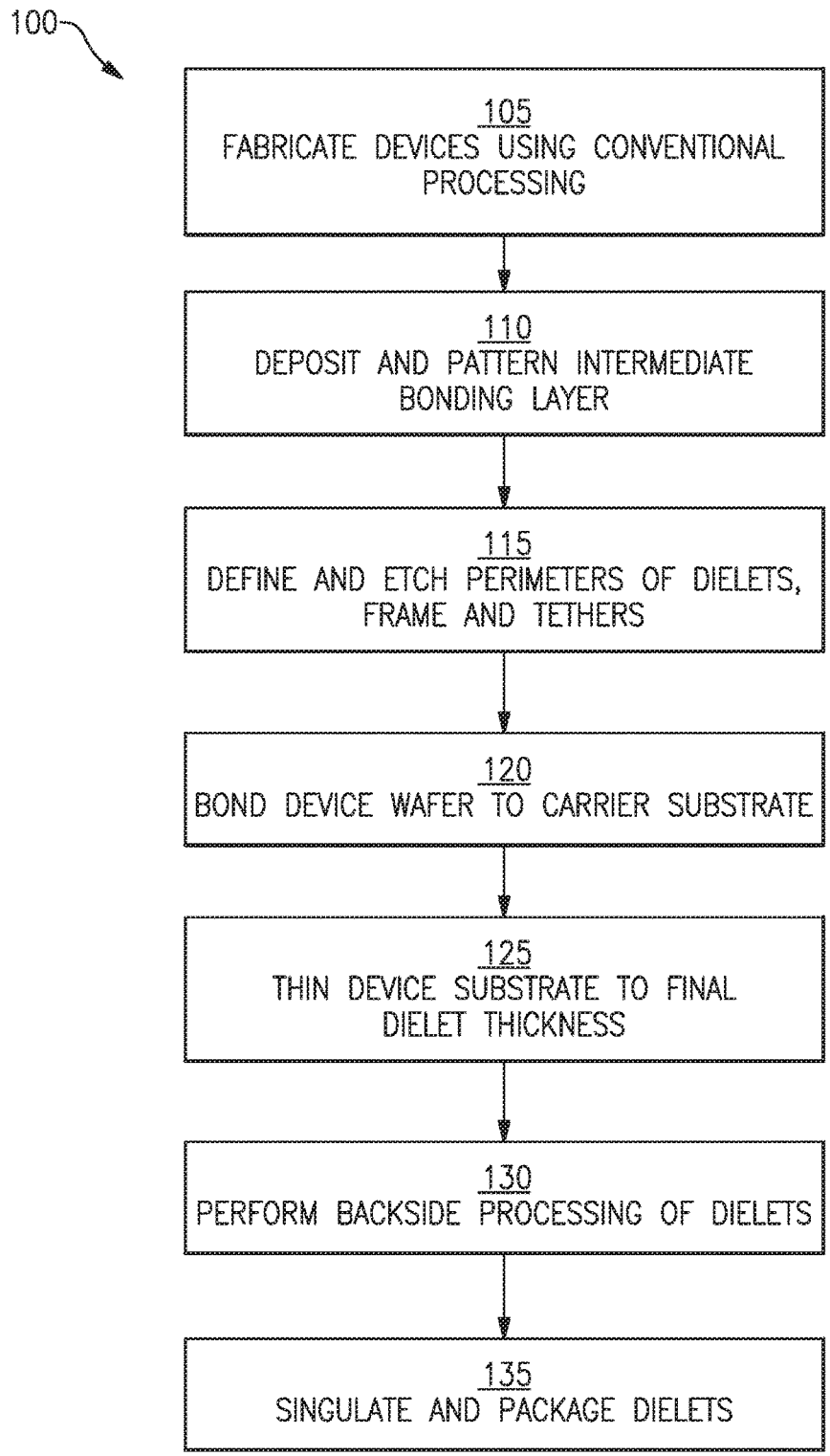
FIG. 1 is a flow chart for an embodiment of a method of fabricating ultra-thin electronic circuit die.
Figure 2:
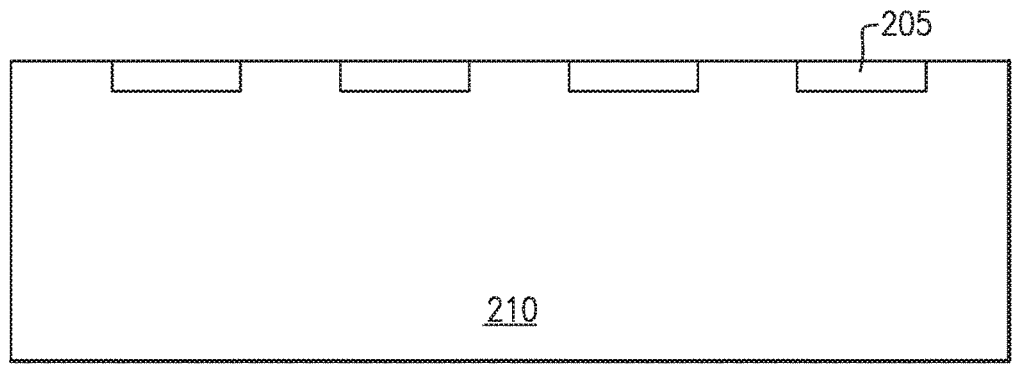
FIG. 2 is a cross sectional diagram of a portion of a semiconductor device wafer at a step of the method of FIG. 1.
Figure 3:
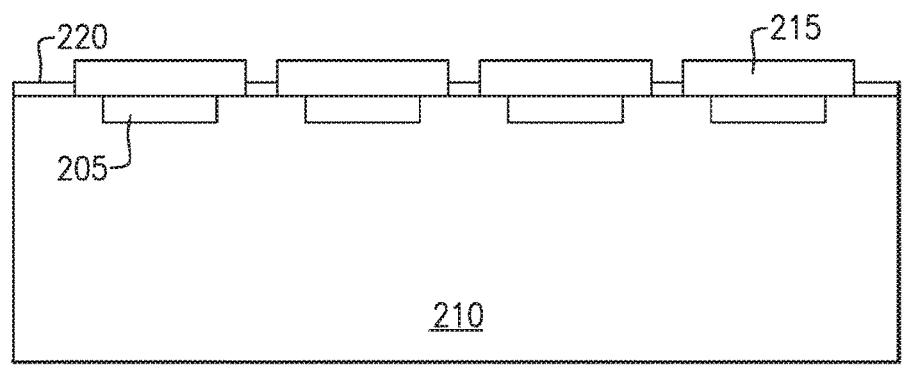
FIG. 3 is a cross sectional diagram of the portion of the semiconductor device wafer of FIG. 2 at another step of the method of FIG. 1.
Figure 4:
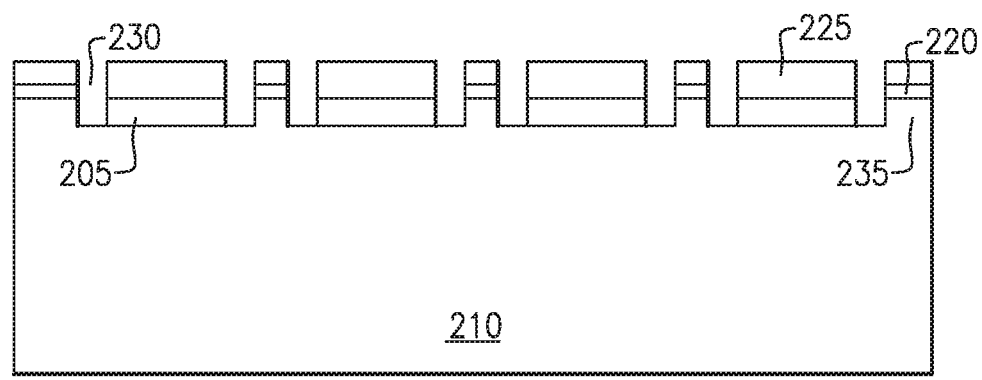
FIG. 4 is a cross sectional diagram of the portion of the semiconductor device wafer of FIG. 2 at another step of the method of FIG. 1.
Figure 5:
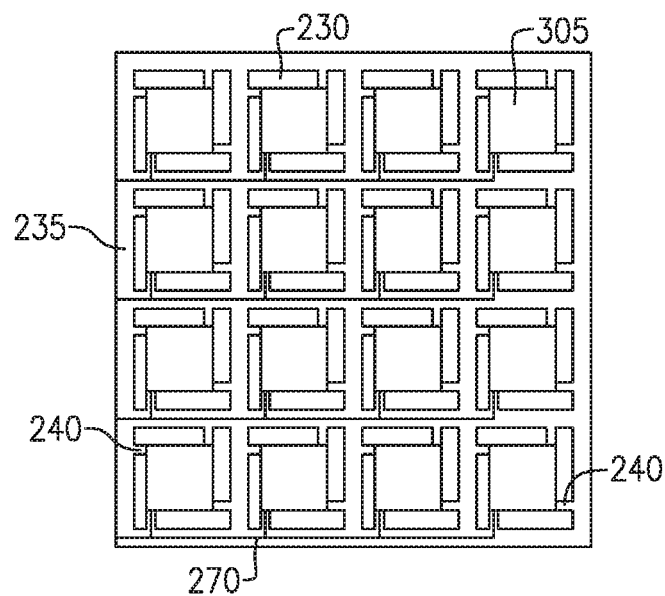
FIG. 5 is a plan view of the portion of the semiconductor device wafer of FIG. 2 at another step of the method of FIG. 1.

Aspects and embodiments disclosed herein are not limited in application to the details of construction and the arrangement of components set forth in the following description or illustrated in the drawings. Aspects and embodiments disclosed herein are capable of being practiced or of being carried out in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items.

Aspects and embodiments disclosed herein include ultra-thin sensor and circuit components and methods for fabricating same. The ultra-thin sensor and/or circuit components may be fabricated on a wafer level and may include five million or more die on a 300 mm wafer. The high die count per wafer is, in some embodiments, enabled by a fabrication process that provides for individual die to be more closely spaced than is conventionally achievable. For example, in some embodiments, individual die may be spaced about 10 µm or less from one another, while conventional processes typically require die-to-die spacings of at least 100 µm to provide adequate space for sawing to singulate the die without causing damage to the die.

In some embodiments, the ultra-thin sensor and/or circuit components may have thicknesses of about 10 µm or less and may have length and width dimensions of about 100 µm each. This is in contrast with conventionally formed semiconductor-based sensors and/or circuit components which often include an active layer that may be about 100 nm thick, disposed on a substrate that is 1 mm or more in thickness. Conventional teachings hold that a relatively thick substrate is needed to provide sufficient mechanical strength for conventionally formed semiconductor-based sensors and/or circuit components to be handled, manipulated, singulated, and packaged without incurring damage. Aspects and embodiments disclosed herein, however, do not require a thick substrate to provide mechanical strength to the disclosed ultra-thin sensor and circuit components, thus providing for reduced thickness and reduced weight devices and packages, improved thermal management, and other advantages discussed herein. Providing the ultra-thin sensor and/or circuit components disclosed herein with thicknesses of about 10 µm or less may render the components mechanically fragile and thus prone to mechanical and/or electrical failure is mishandled, for example, if disposed in a security tag that one attempts to remove from an object to which the security tag is attached. The ultra-thin sensor and/or circuit components disclosed herein may thus be less tolerant of mishandling and more tamper resistant than conventional sensor and/or circuit components having thicker substrates.

In some embodiments, ultra-thin sensor and/or circuit components disclosed herein may be utilized in thin, flexible electronics, in transparent electronic structures, in miniaturized electronics for micro-scale systems, or in embedded electronic security and/or identification tags. In some embodiments disclosed herein the ultra-thin sensor and/or circuit component die are rendered tamper resistant or tamper proof by the incorporation of fragility enhancing features which would damage the die if the die were used in an unintended manner or transferred from their intended position.

In one embodiment, ultra-thin sensor and/or circuit component die, referred to herein as "dielets," may be fabricated in accordance with the method 100 illustrated in the flowchart of FIG. 1 and the corresponding figures FIGS. 2-11D.

In act 105 of method 100, sensor and/or circuit components are fabricated in active regions 205 of a semiconductor wafer 210 (see FIG. 2), for example, a silicon wafer having a diameter of, for example, 200 mm or 300 mm. The semiconductor wafer 210 is also referred to herein as a device wafer. The sensor and/or circuit components may be fabricated utilizing conventional CMOS processing.

In act 110, a patterned intermediate bonding layer 220 is deposited on the upper surface of the semiconductor wafer 210. A layer of photoresist 215 may be deposited and patterned in accordance with known semiconductor fabrication methods and a layer of metal, for example, copper or gold may be deposited in patterned apertures or gaps between regions of deposited photoresist 215 to form the patterned intermediate bonding layer 220. In other embodiments, the intermediate bonding layer 220 may include, for example, silicon dioxide for use in bonding to a carrier wafer in a later step, solder, a bonding material such as Wafer-BOND® HT-10.10 temporary bonding material available from Brewer Science, Inc., Rolla, Mo. or any other temporary wafer bonding material known in the art or other materials known in the art that may be used for wafer-wafer bonding.

The photoresist layer 215 and any material that was deposited on top of the photoresist layer 215 is removed in accordance with known semiconductor fabrication methods, for example, by ashing followed by wet cleaning (e.g., in a sulfuric acid/hydrogen peroxide bath). A second photoresist layer 225 is then deposited and patterned to define apertures around the active regions 205. The semiconductor wafer 210 is then etched using, for example, reactive ion etching (RIE) or anisotropic deep silicon etching (DRIE) to form trenches 230 around the perimeters of the active regions 205 (act 115). Portions of the semiconductor wafer 210 that are not etched away in act 115 will form a frame 235 that will support and retain dielets 305 that will be formed from the active regions 205 (See FIG. 5). In some embodiments, the frame 235 includes a grid of legs with widths of, for example, about 10 μm or less, and in some embodiments, as thin as 1 μm. Portions of the semiconductor wafer 210 around the perimeters of the active regions 205 are left unetched to form at least one tether 240 for each dielet 305 that will couple the dielets 305 to the frame 235. In some embodiments, the tethers 240 may have dimensions of about 10 μm in width and lengths of between about 3 μm and about 40 μm. After etching the trenches in the semiconductor wafer 210 to define the perimeters of the dielets 305, frame 235, and tethers 240, the photoresist layer 225 is removed.

Figure 6:
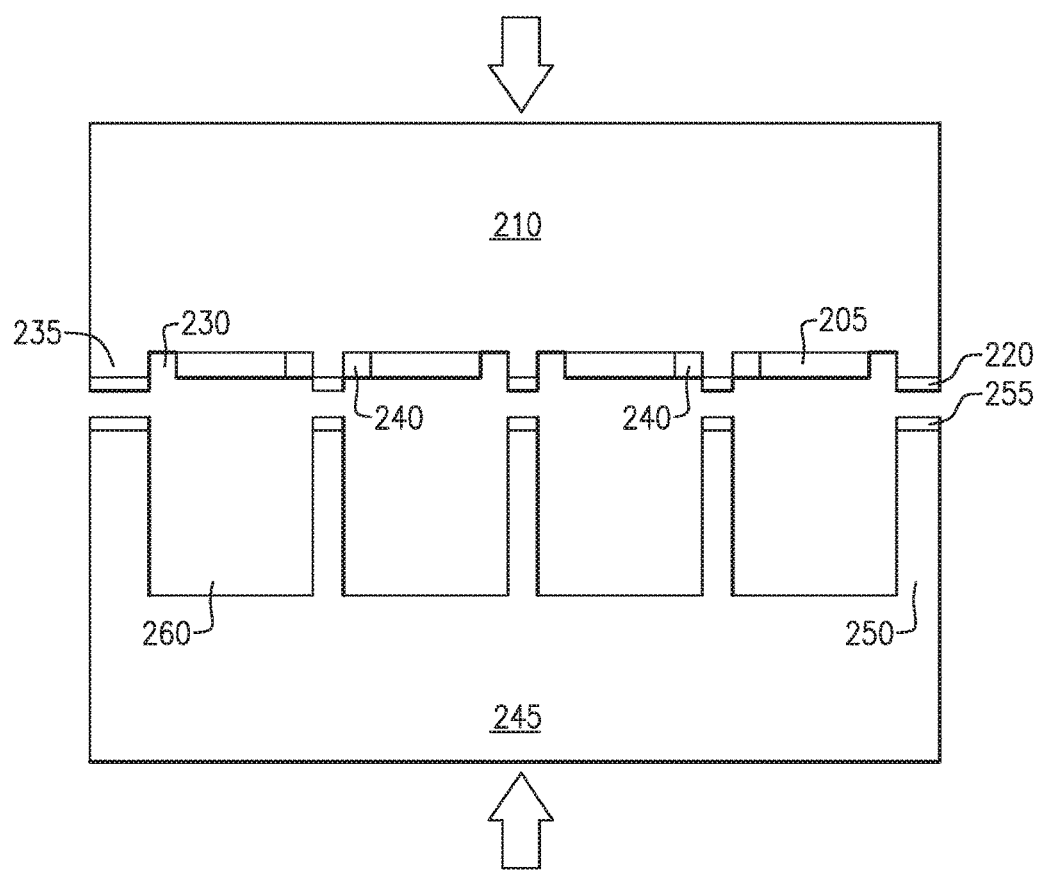
FIG. 6 is a cross sectional diagram of the portion of the semiconductor device wafer of FIG. 2 being joined to a carrier wafer at another step of the method of FIG. 1.
Figure 7:
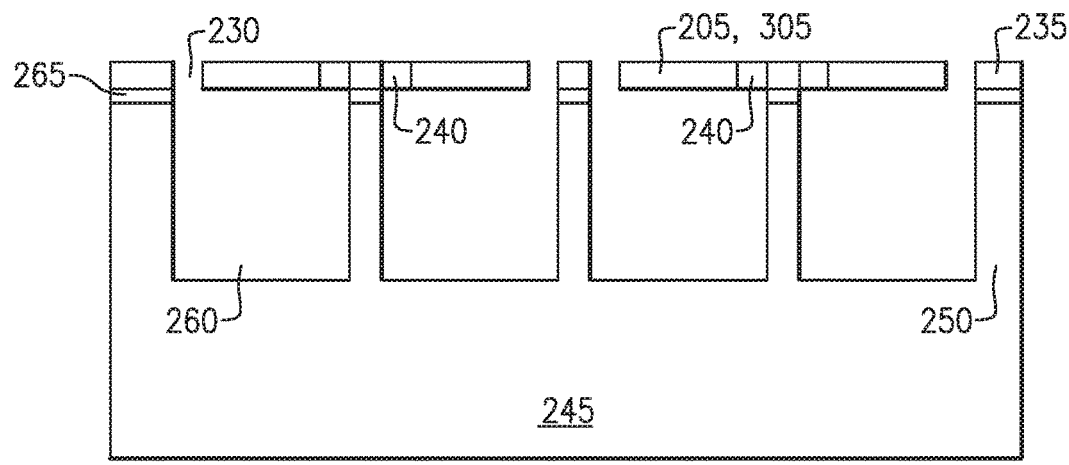
FIG. 7 is a cross sectional diagram of the portion of the semiconductor device wafer of FIG. 2 joined to the carrier wafer of FIG. 6 at another step of the method of FIG. 1.
Figure 8:
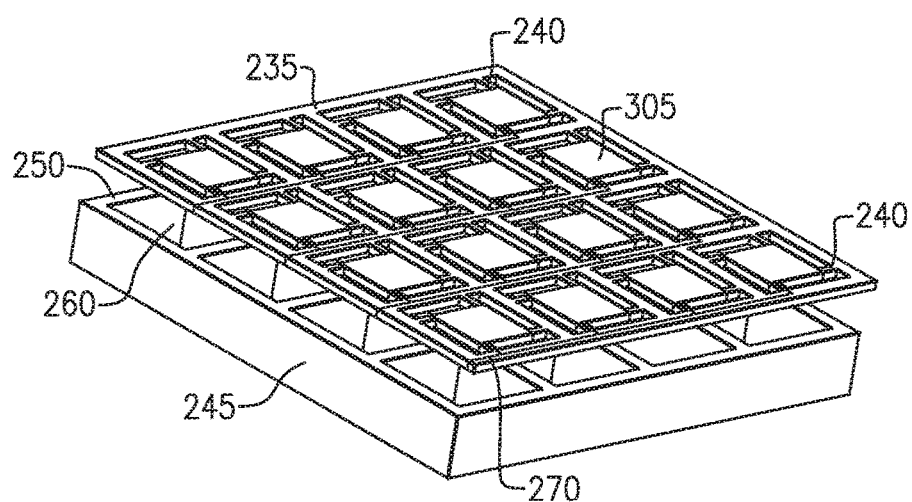
FIG. 8 is an exploded perspective view of the portion of the semiconductor device wafer of FIG. 2 and the carrier wafer of FIG. 7.
Figure 9:
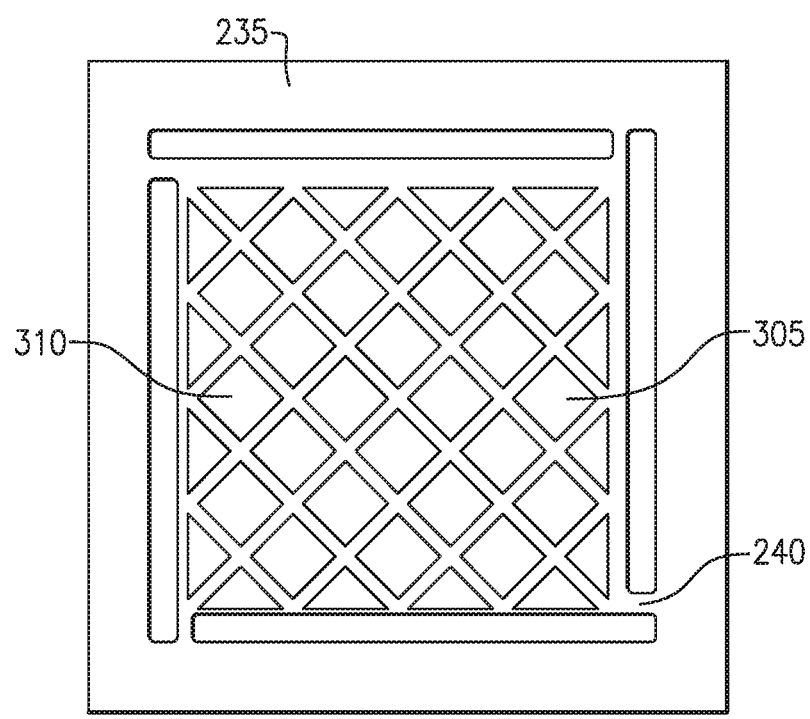
FIG. 9 is an illustration of a rear side of one embodiment of a dielet coupled to a frame with tethers.
Figure 10A:
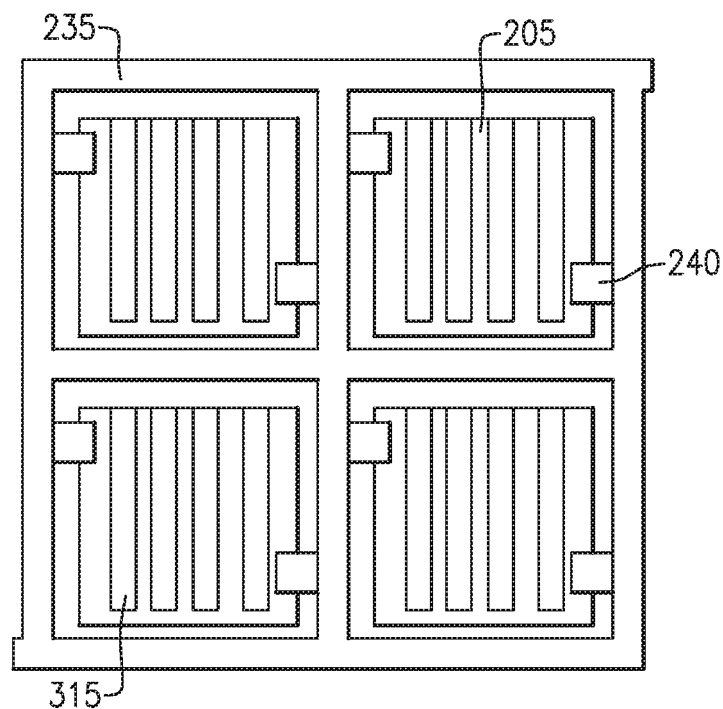
FIG. 10A is an illustration of an embodiment of fragility enhancing features formed on dielets.
Figure 10B:
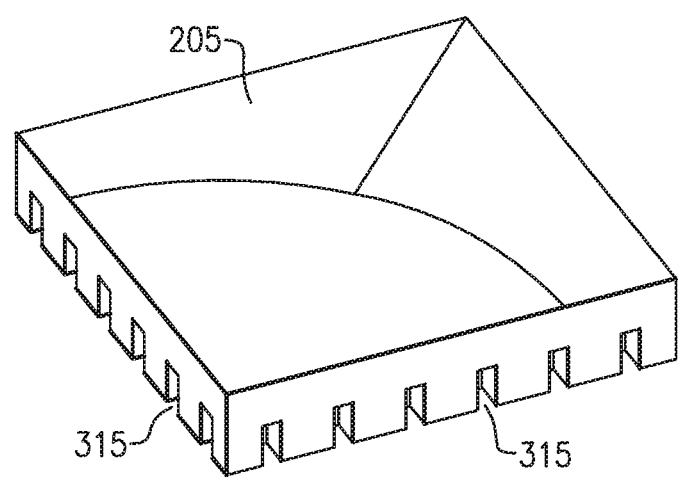
FIG. 10B is an illustration of another embodiment of a fragility enhancing feature formed on a dielet.

In act 120 the etched semiconductor wafer 210 is coupled to a carrier wafer 245 (See FIG. 6). The carrier wafer 245 includes cavities 260 that were previously etched and that correspond to the positions of the active regions 205/dielets 305. In some embodiments, the cavities 260 may extend through the carrier wafer 245 to form apertures passing through the carrier wafer 245. The carrier wafer 245 may be a silicon wafer. A perspective view illustrating the cavities 260 in the carrier wafer is shown in the exploded view in FIG. 8. The etched semiconductor wafer 210 is aligned with and coupled to the carrier wafer 245 such that walls 250 defining the cavities 260 mate with the unetched frame 235 defined in the semiconductor wafer 210 and the active regions 205/dielets 305 are surrounded by the walls 250 defining the cavities 260.

The walls 250 defining the cavities 260 include a layer of bonding material 255 corresponding to the intermediate bonding layer 220. The material of the layer of bonding material 255 may be the same as or different than the material of the intermediate bonding layer 220. The etched semiconductor wafer 210 is coupled to the carrier wafer 245 by joining the layer of bonding material 255 to the intermediate bonding layer 220 using a process selected based on the materials of these layers to form bond 265 (See FIG. 7). Thermo-compression bonding may be used to join the layer of bonding material 255 to the intermediate bonding layer 220 if these layers include a metal, for example, gold or copper. Direct bonding may be used to join the layer of bonding material 255 to the intermediate bonding layer 220 if these layers include silicon dioxide. Application of heat and/or pressure may be used to join the layer of bonding material 255 to the intermediate bonding layer 220 if these layers include solder or a bonding material such as Wafer-BOND® HT-10.10 temporary bonding material.

The carrier wafer 245 provides a number of advantages. The carrier wafer 245 provides mechanical support to the semiconductor wafer 210 during thinning (described below), provides support for the dielets 305 formed from the semiconductor wafer 210 during transport and handling, eliminates stiction of ultra-thin dielets 305 due to static electricity or van der Waals interactions, and eliminates the need for cleaning of conventional tape/laminate residue from the dielets 305 by eliminating the need for such conventional tape/laminate to support the dielets 305 during singulation. Further, the isolated cavities 260 in the carrier wafer 245 ensure a high-yield process by isolating each dielet 305 from etch non-uniformity (a source of yield loss) during thinning of the semiconductor wafer 210.

In act 125, the etched semiconductor wafer 210 is thinned until the bottom of the trenches 230 (illustrated on top of the structure in FIG. 7) are exposed and the dielets 305 including the active regions 205 are suspended by the tethers 240 to the frame 235. Wafer thinning may be accomplished in a number of different manners. In some embodiments, the etched semiconductor wafer 210 is thinned via backside grinding (BSG) followed by chemical mechanical polishing (CMP) as is known in the art. In other embodiments, a combination of mechanical grinding and chemical etching may be utilized to thin the etched semiconductor wafer 210. Mechanical grinding, however, often induces subsurface damage in the crystal lattice of semiconductor wafers that can extend 10 s of micrometers deep and is thus generally used with substrates having thicknesses of about 100 μm or more. In a further embodiment, a combination of CMP and chemical etching maybe utilized to thin the etched semiconductor wafer 210. In this embodiment, the bulk of the substrate of etched semiconductor wafer 210 is removed by CMP (or BSG) until approximately 50 μm of material to be removed remains. The last approximately 50 μm of substrate material to be removed is removed via a spin etching process using a hydrofluoric acid-nitric acid mixture. In some embodiments, the hydrofluoric acid-nitric acid mixture may include 1 part hydrofluoric acid, 9 parts nitric acid, and 3 parts acetic acid. Water may be substituted for acetic acid. In the spin etching process the semiconductor wafer 210 (and attached carrier wafer 245) is rotated at a few thousand rpm while the hydrofluoric acid-nitric acid etchant mixture is dispensed onto a central point of the rotating semiconductor wafer 210. In some embodiments, the tethers 240 are formed with rotational symmetry and the rotational symmetry of the tethers 240 allows for spin etching at few thousand rpm without induced mechanical damage. The spin etching approach avoids the need for edge protection techniques and in combination with the frame/tether architecture results in a high-throughput, high-yield process. In other embodiments, the final 50 μm of removal is accomplished with an RIE process.

In act 130 backside processing may be performed on the dielets 305. In some embodiments backside processing of the dielets may include depositing and patterning electrical traces 270 on the frame 235 and in electrical contact with the dielets 305. The electrical traces 270 are, in some embodiments, electrically contacted with devices on front sides of the dielets 305 by conductive vias (not shown) extending from the rear to the front sides of the dielets 305. The electrical traces 270 may include, for example, copper or aluminum or another conductor used in semiconductor fabrication. The electrical traces 270 may be utilized for electrical testing and/or programming of the electrical circuitry of the dielets 305. In some embodiments, the tethers 240 each support one or several of the electrical traces 270 to electrically test and/or program the circuitry of the dielets 305. A portion of the semiconductor wafer 210 thinned down to form the dielets 305, tethers 240, and frame 235, and including electrical traces 270 is illustrated in plan view in FIG. 5, and in exploded view along with a corresponding portion of the carrier wafer 245 in FIG. 8. Backside processing may also include the formation of bond pads and/or interconnects, for example, solder balls on the rear faces of the dielets 305 to facilitate packaging or electrical and mechanical connection of the dielets 305 to other structures to form stacked multi-layer electronic devices.

The backside processing of the dielets 305 may also include incorporating fragility enhancing features into the dielets 305. Fragility features are desirable in some implementations to safeguard the dielets 305 after singulation. In some embodiments, a singulated dielet would be placed on something valuable that can be counterfeited, such as on a host chip (e.g. a CPU or FPGA), on some other item for which authentication of identity is required, or in an RFID tag or other security/identification tag. The electronic features of the CMOS layers in the dielet 305 may provide for authentication, and the fragility enhancing features protect against someone removing the dielet 305 from its host object and transferring the dielet 305 to another host object. In some implementations, if the dielet declares its host authentic, it would be undesirable if one could pull the dielet off its host and apply it to a non-authentic host. The fragility enhancing features may cause the dielet to self-destruct, for example, fracture, or self-degrade, for example, degrade the electronic properties of circuitry (e.g., reduce carrier mobility) in the dielet if someone attempted to remove it from its intended host object.

In one example, portions of the tethers 240 may be etched or notched to facilitate fracture of the tethers 240 during singulation of the dielets 305. Additionally or alternatively, the backsides of the dielets 305 may be etched to form patterns of etchings in the form of recesses 310 (See FIG. 9) and/or grooves 315 (See FIGS. 10A, 10B). These patterns of etchings (recesses 310 and/or grooves 315) are fragility enhancing features that decrease the mechanical strength of the individual dielets 305. These fragility enhancing features may render the singulated dielets 305 tamper resistant. If the singulated dielets 305 are handled in an unintended manner, the recesses 310 and/or grooves 315 may allow the dielets 305 to flex and mechanically damage electrical components, for example, transistors in the circuitry of the dielets 305, or fracture, rendering them less functional or even non-functional.

In act 135, the dielets are singulated and removed from the frame 235 and packaged. An appropriate conventional vacuum pick and place tool, possibly with a tip adaptor specifically designed to interface with the dielets, and optionally using the vacuum capability to pull the dielets out, or to hold the dielets after punching the dielets out may be utilized to punch out individual dielets 305 from the frame 235. In other embodiments, laser ablation of the tethers 240 may be used to singulate the individual dielets 305. Alternatively or additionally, Joule heating of the tethers by resistive means, using resistive heaters deposited on the tethers along with the traces 270 may be used to weaken or remove the tethers, thus enabling or facilitating singulation.

Figure 11A:
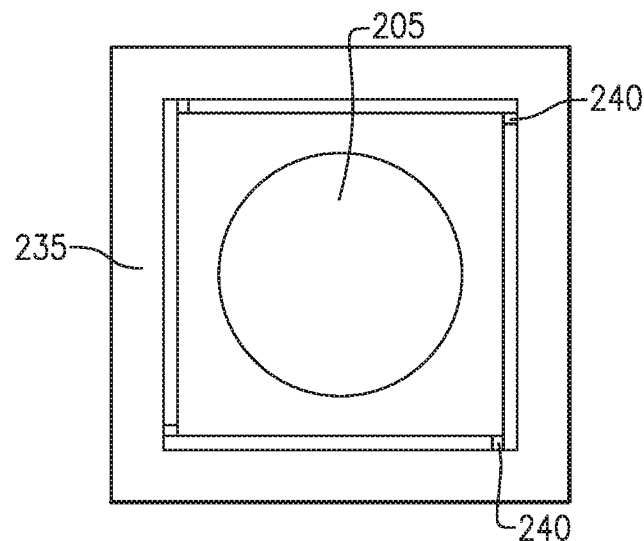
FIG. 11A is an embodiment of a tether configuration.
Figure 11B:
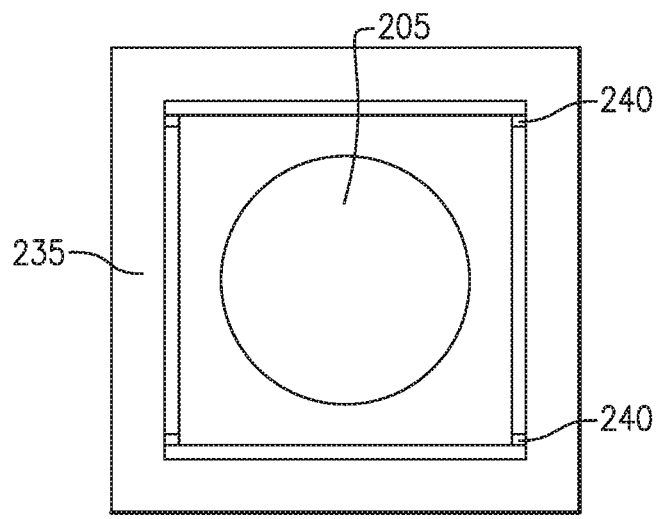
FIG. 11B is another embodiment of a tether configuration.
Figure 11C:
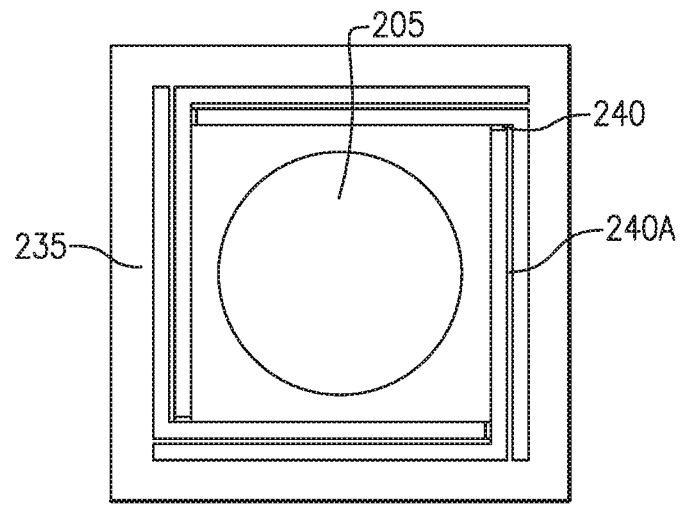
FIG. 11C is another embodiment of a tether configuration.
Figure 11D:
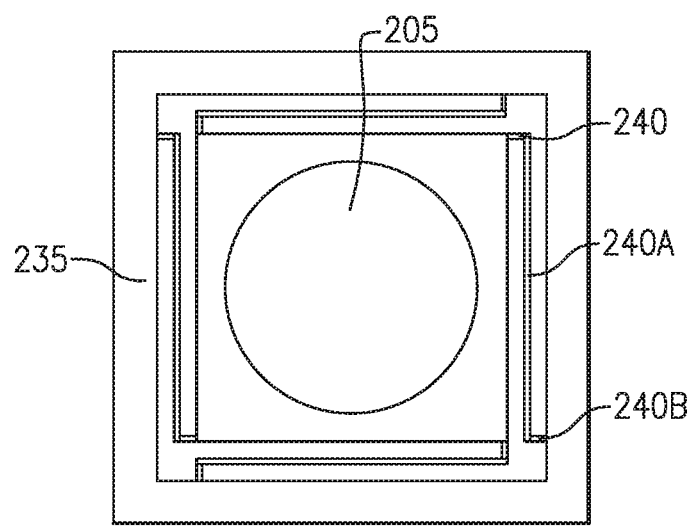
FIG. 11D is another embodiment of a tether configuration.

In the embodiments illustrated above, one configuration of tethers 240 for temporarily securing the dielets 305 to the frame 235 was illustrated. In other embodiments different tether structures may be utilized. For example, FIG. 11A illustrates a spiral tether structure with tethers 240 arranged in a similar manner as in, for example, FIG. 5. FIG. 11B illustrates a H-structure for tethers 140 where two tethers 140 are present on each of two opposite sides of a dielet 305. FIG. 11C illustrates a "Crab Leg L" type tether structure where the tethers 240 include cantilevers 240A connecting the tethers 240 to the frame 235. FIG. 11D illustrates a "Crab Leg S" type tether structure where the tethers 240 include beams 240A connecting the tethers 240 to the frame 235 via secondary tethers 240B. Each of the tether structures shown in FIGS. 11A-11D have different mechanical strengths and react differently to vibrational excitation of the frame 235 and may be selected based on desired properties of the dielet 305/frame 235 connection.

Figure 12:
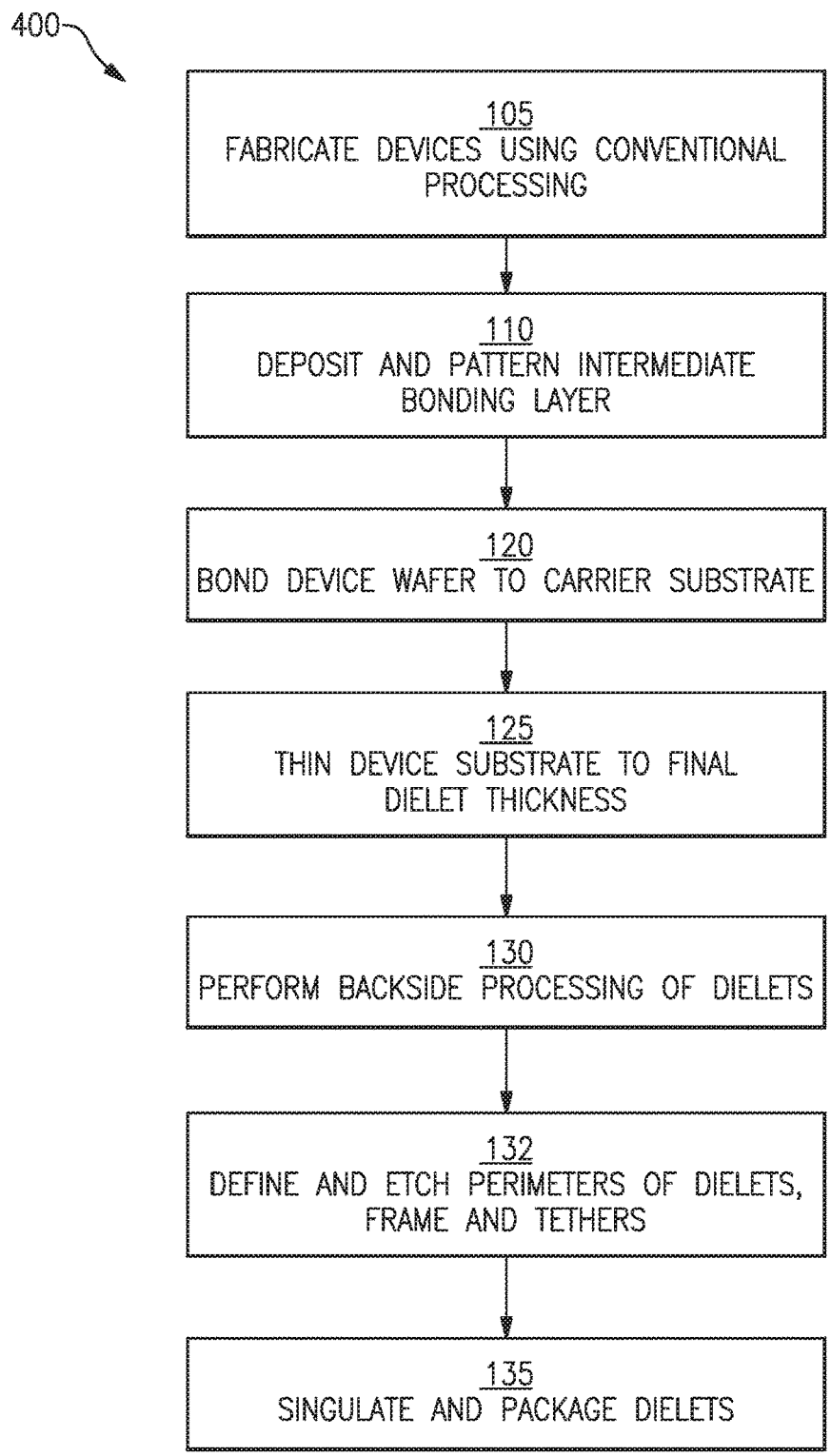
FIG. 12 is a flow chart for another embodiment of a method of fabricating ultra-thin electronic circuit die.
Figure 13:
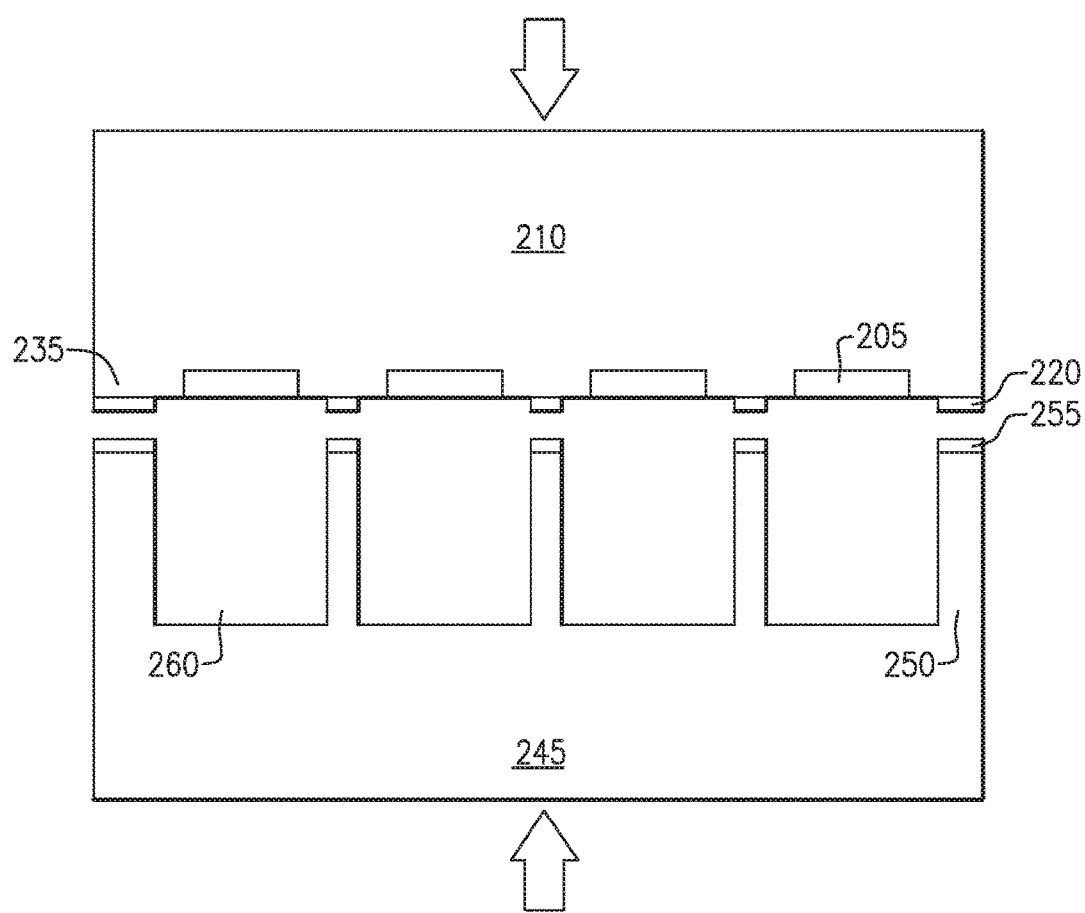
FIG. 13 is a cross sectional diagram of a portion of a semiconductor device wafer being joined to a carrier wafer at a step of the method of FIG. 12.
Figure 14:
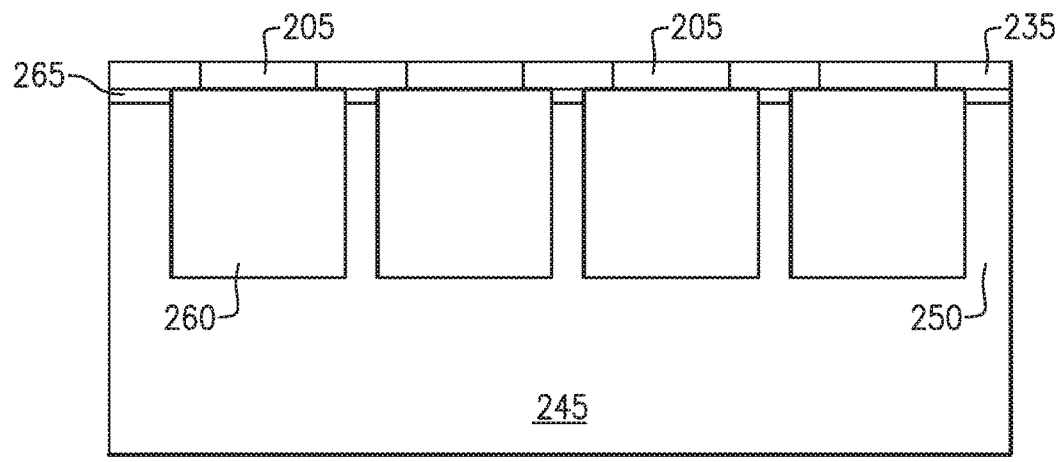
FIG. 14 is a cross sectional diagram of a portion of a semiconductor device wafer after thinning and joining to a carrier wafer at a step of the method of FIG. 12.
Figure 15:
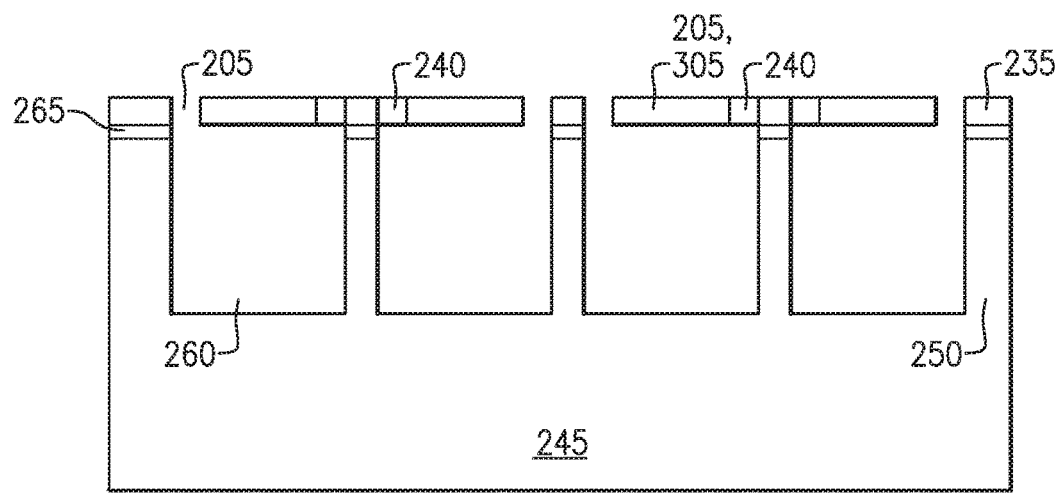
FIG. 15 is a cross sectional diagram of a portion of a semiconductor device wafer after joining to a carrier wafer and etching of trenches at a step of the method of FIG. 12.

Another example of a method 400 for forming ultra-thin sensor and/or circuit component dielets is illustrated in the flowchart in FIG. 12 and associated FIGS. 13-15. The method 400 is similar to method 100 of FIG. 1, however, act 115 of method 100 is omitted and replaced with act 132. In method 400 the act of etching the perimeters of dielets 205 to define the frame 235 and tethers 240 is performed after thinning of the semiconductor wafer 210 and/or performing backside processing of the dielets 205. For example, as illustrated in FIG. 13, with comparison to FIG. 6, the semiconductor wafer 210 including active areas 205 is bonded to the carrier wafer 245 without first etching trenches 230. Wafer thinning of the semiconductor wafer 210 is performed to result in a structure such as that illustrated in FIG. 14 prior to etching the trenches 230 to define the frame 235 and tethers 240 and result in the structure shown in FIG. 15, which is substantially the same as the structure of FIG. 7.

Figure 16:
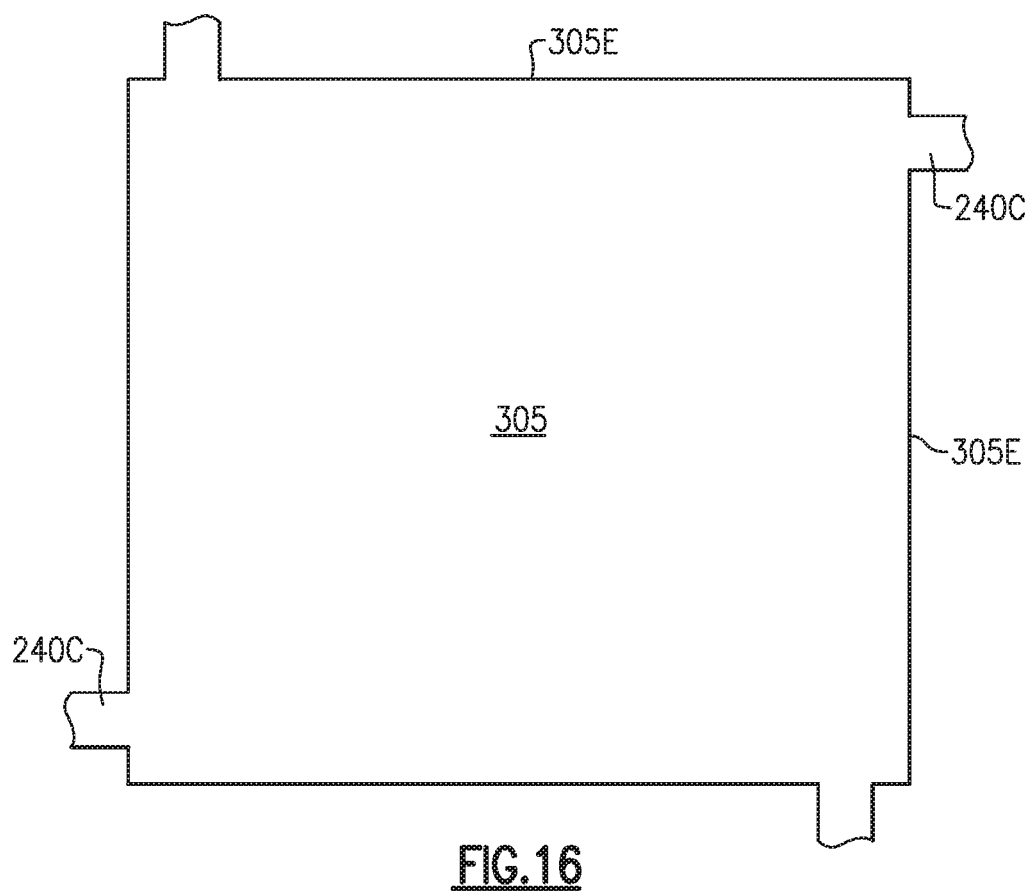
FIG. 16 is a simplified illustration of a singulated dielet.

In either of methods 100 or 400, singulation of the dielets 305 may result in portions or remnants 240C of one or more tethers 240 remaining attached to, disposed on, coupled to, or extending from one or more side edges 305E of singulated dielets 305. FIG. 16 is a simplified diagram of a singulated dielet 305 illustrating tether remnants 240C coupled to dielet edges 305E. Depending on how the tethers 240 were arranged to couple the dielets 305 to the frame 235 during processing, the tether remnants 240C may be located proximate or at one or more corners of the singulated dielets 305 as illustrated in FIG. 16, or in other embodiments, proximate or at a central or midway point along one or more of the dielet edges 305E.

Example: Comparison of Thinning Methodologies

Figure 17:
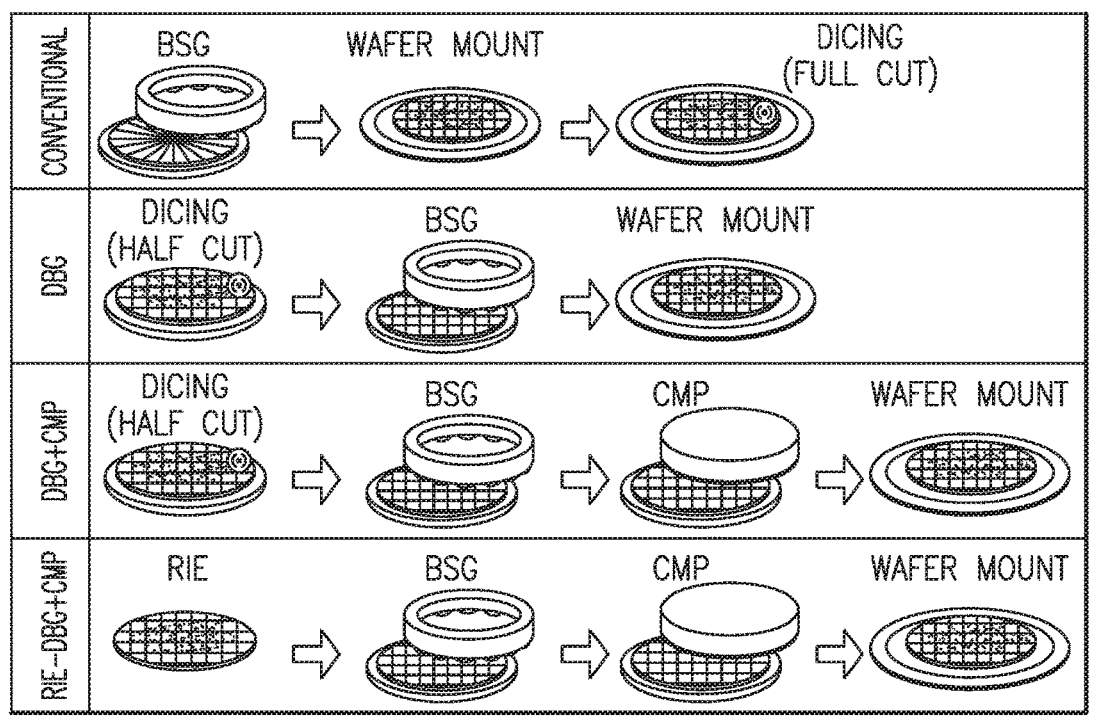
FIG. 17 illustrates examples of methods of thinning a device wafer.

The approach to dielet singulation described in the present invention compares favorably with existing methods. Examples of some existing methods are illustrated in FIG. 17, which is reproduced from S. Takyu, T. Kurosawa, N. Shimizu, S. Harada, "Novel Wafer Dicing and Chip Thinning Technologies Realizing High Chip Strength," IEEE Electronic Components and Technology Conference, 2006. A first method, labelled "Conventional" in FIG. 17 includes back side grinding (BSG) followed by wafer mount and full cut dicing of individual die. In the first method, the wafer is mounted onto a tape designed for dicing ("dicing tape") after it is thinned by BSG. Then, a dicing saw is used to cut all the way through the wafer to the tape ("full cut"). In a second method, labeled "DBG" in FIG. 17, half cut dicing is first performed on the die, followed by a BSG step and then wafer mounting. In the second method, the dicing saw cuts only half way through, and then the wafer is thinned from the back (BSG). Thus, the cut is completed when the amount removed from the back plus the depth of the original sawing is equal to the starting wafer thickness (i.e. the backside grind intersects the partially sawed grooves from the front). In a third method, labeled "DBG+CMP" in FIG. 17, half cut dicing is first performed on the die, followed by a BSG step, a chemical mechanical polishing (CMP) step, and then wafer mounting. The third method is similar to the second method, except CMP is used for part of the thinning, since it is less aggressive and less damaging than BSG, although slower and more expensive. In a fourth method, labeled "RIE–DBG+CMP" in FIG. 17, reactive ion etching (RIE) is first performed to partially thin the device wafer 210 and is followed by a BSG step, a CMP step, and then wafer mounting. The fourth method is similar to the third method except it uses reactive ion etching (RIE) instead of a saw to cut partway through the wafer, since RIE is cleaner than sawing.

Figure 18:
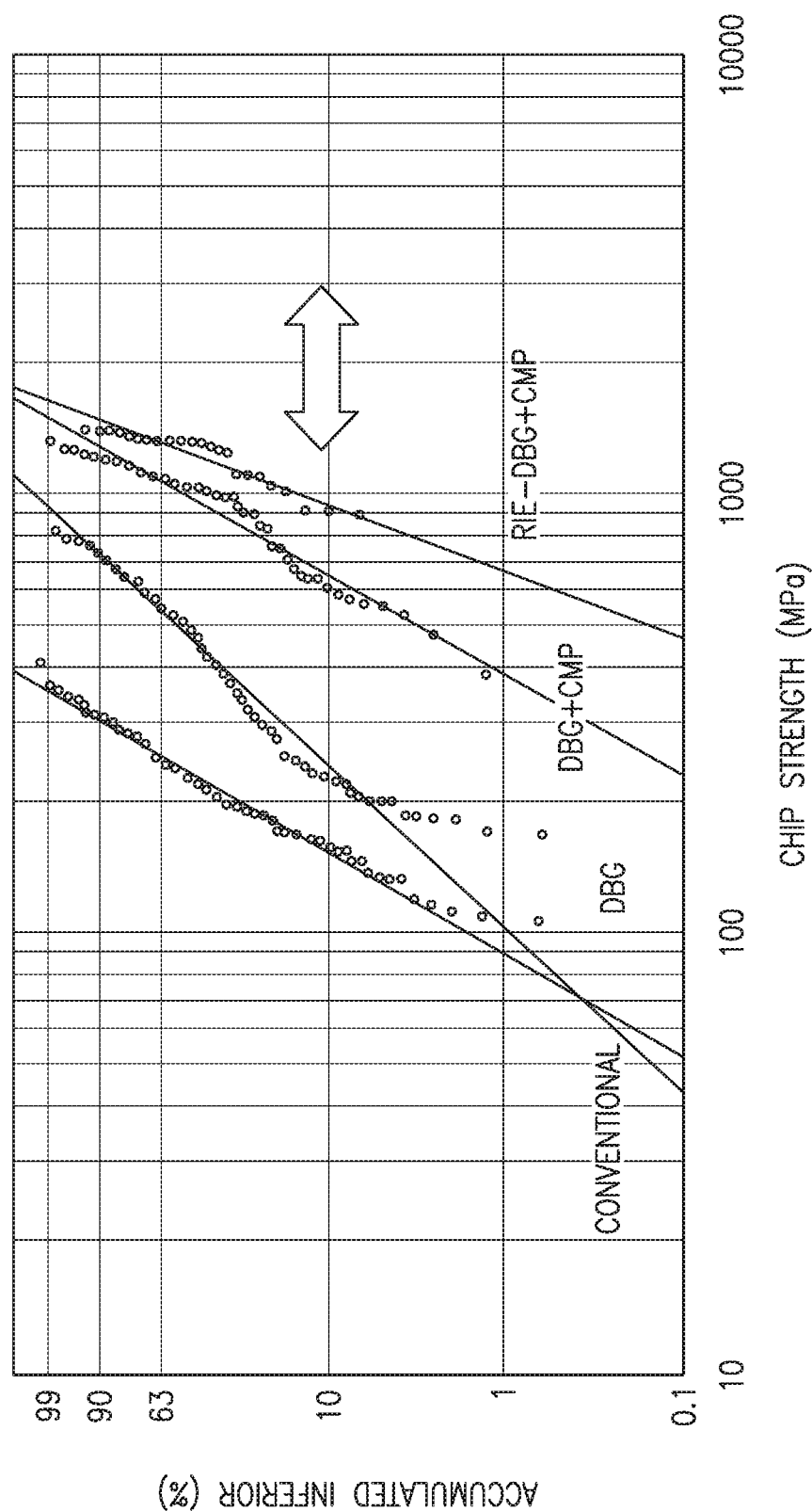
FIG. 18 illustrates die strengths of dies produced in processes including the thinning methods of FIG. 17.

FIG. 18, reproduced from the Takyu et al. paper referenced above, is a chart illustrating the observed mechanical strength of die obtained from the processes including the different backside thinning methods illustrated in FIG. 17. In FIG. 18 at a particular strength on the X axis, the corresponding Y axis is the percentage of chips from the sample that have that strength or less. For example, following the "conventional" line, 1% of chips have strength of 100 MPa or less, 10% have strength of about 150 MPa or less, and 90% have strength of about 300 MPa or less. These results show that the choice of wafer thinning method has an effect on resultant die strength. BSG thinning alone resulted in the weakest die. The addition of CMP and RIE resulted in die of increased strength as compared with the die resulting from the process including the BSG thinning method alone. It is expected that the method of wafer thinning using CMP (or BSG) followed by spin etching described above would result in die of even higher strengths, for example in the region indicated on the right side of the chart of FIG. 18 by the double sided arrow.

Having thus described several aspects of at least one embodiment of this invention, it is to be appreciated various alterations, modifications, and improvements will readily occur to those skilled in the art. For example, the acts in the disclosed methods may be performed in alternate orders and one or more acts in the disclosed methods may be omitted or substituted by alternative acts or additional acts may be added. Such alterations, modifications, and improvements are intended to be part of this disclosure, and are intended to be within the spirit and scope of the invention. Accordingly, the foregoing description and drawings are by way of example only.

What is claimed is:

1. A method of fabricating ultra-thin semiconductor devices, the method comprising:
    forming an array of semiconductor dielets mechanically suspended on a frame with at least one tether connecting each semiconductor dielet of the array of semiconductor dielets to the frame;
    forming active layers including active devices on upper surfaces of the dielets; and
    forming fragility enhancing features in the semiconductor dielets on lower surfaces of the dielets, the fragility enhancing features not extending fully through the dielets to the upper surfaces.

2. The method of claim 1, wherein forming the fragility enhancing features in the semiconductor dielets includes forming etchings in the semiconductor dielets.

3. The method of claim 1, wherein the fragility enhancing features are configured to cause the semiconductor dielets to fracture under influence of an external force.

4. The method of claim 1, wherein the fragility enhancing features are configured to cause the semiconductor dielets to deform and become strained in a manner that degrades electrical performance under influence of an external force.

5. The method of claim 4, wherein the fragility enhancing features are configured to cause the semiconductor dielets to deform and become strained in a manner that alters carrier mobility in transistors of the semiconductor dielets under the influence of the external force.

6. The method of claim 1, further comprising etching a notch in the at least one tether.

7. The method of claim 1, further comprising:
    bonding a device wafer including active areas to a carrier wafer, the active areas facing the carrier wafer and aligned with recesses defined in the carrier wafer;
    thinning the device wafer; and
    etching trenches about the peripheries of the active areas, the trenches defining the at least one tether, boundaries of the semiconductor dielets, and the frame.

8. The method of claim 7, comprising etching the trenches prior to bonding the device wafer to the carrier wafer.

9. The method of claim 7, comprising etching the trenches subsequent to thinning the device wafer.

10. The method of claim 7, wherein thinning the device wafer includes thinning the device wafer to a thickness of about 10 μm.

11. The method of claim 7, wherein thinning the device wafer includes spin etching a rear side of the device wafer.

12. The method of claim 1, wherein forming the array of semiconductor dielets includes forming the semiconductor dielets with thicknesses of about 10 μm.

13. The method of claim 1, wherein forming the array of semiconductor dielets includes forming the semiconductor dielets with spacings of about 10 μm to 50 μm between adjacent semiconductor dielets.

14. The method of claim 1, further comprising forming electrically conductive traces on the frame and in electrical communication with the semiconductor dielets.

15. The method of claim 1, further comprising singulating the semiconductor dielets from the frame by mechanically punching the semiconductor dielets from the frame.

16. The method of claim 1, further comprising singulating the semiconductor dielets from the frame by pulling the semiconductor dielets from the frame using a vacuum pick tool.

17. The method of claim 1, further comprising singulating the semiconductor dielets from the frame by destroying the at least one tether by laser ablation.

18. A method of fabricating ultra-thin semiconductor devices, the method comprising:
    forming an array of semiconductor dielets mechanically suspended on a frame with at least one tether connecting each semiconductor dielet of the array of semiconductor dielets to the frame; and
    forming fragility enhancing features in the semiconductor dielets, the fragility enhancing features being configured to cause the semiconductor dielets to deform and become strained in a manner that degrades electrical performance under influence of an external force, the external force exacerbating pre-existing inherent strain that exists in fabricated active devices of the semiconductor dielets caused by oxide and/or interlayer dielectric (ILD) and metal routing layers to achieve a strain that causes failure of the semiconductor dielets.

19. A method of fabricating ultra-thin semiconductor devices, the method comprising:

forming an array of semiconductor dielets mechanically suspended on a frame with at least one tether connecting each semiconductor dielet of the array of semiconductor dielets to the frame; and singulating the semiconductor dielets from the frame by destroying the at least one tether with a joule heater integrated into the at least one tether.

* * * * *